United States Patent
Yang et al.

(10) Patent No.: US 9,385,229 B2
(45) Date of Patent: Jul. 5, 2016

(54) SEMICONDUCTOR DEVICE WITH IMPROVED BREAKDOWN VOLTAGE

(71) Applicants: Hongning Yang, Chandler, AZ (US); Xin Lin, Phoenix, AZ (US); Zhihong Zhang, Chandler, AZ (US); Jiang-Kai Zuo, Chandler, AZ (US)

(72) Inventors: Hongning Yang, Chandler, AZ (US); Xin Lin, Phoenix, AZ (US); Zhihong Zhang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/495,508

(22) Filed: Sep. 24, 2014

(65) Prior Publication Data

US 2016/0087096 A1   Mar. 24, 2016

(51) Int. Cl.
*H01L 29/78*   (2006.01)
*H01L 29/66*   (2006.01)

(52) U.S. Cl.
CPC ...... *H01L 29/7824* (2013.01); *H01L 29/66681* (2013.01)

(58) Field of Classification Search
CPC .................. H01L 29/7824; H01L 29/66681
See application file for complete search history.

(56) References Cited

U.S. PATENT DOCUMENTS

| | | | |
|---|---|---|---|
| 5,569,949 A | 10/1996 | Malhi | |
| 6,048,772 A * | 4/2000 | D'Anna | 438/301 |
| 6,352,901 B1 | 3/2002 | Chang | |
| 6,365,932 B1 | 4/2002 | Kouno et al. | |
| 8,193,585 B2 | 6/2012 | Grote et al. | |
| 8,489,353 B2 | 7/2013 | Raphael | |
| 2003/0085414 A1 | 5/2003 | Okuno et al. | |
| 2004/0065919 A1 | 4/2004 | Wilson et al. | |
| 2004/0094783 A1 | 5/2004 | Hong | |
| 2004/0145027 A1 * | 7/2004 | Nitta et al. | 257/492 |
| 2004/0238913 A1 * | 12/2004 | Kwon et al. | 257/492 |
| 2005/0001248 A1 | 1/2005 | Rhodes | |
| 2005/0073007 A1 | 4/2005 | Chen et al. | |
| 2006/0081836 A1 | 4/2006 | Kimura et al. | |
| 2007/0164443 A1 | 7/2007 | Florian et al. | |
| 2009/0085101 A1 | 4/2009 | Huang et al. | |
| 2010/0032758 A1 | 2/2010 | Wang et al. | |
| 2012/0112277 A1 | 5/2012 | Denison et al. | |
| 2013/0032880 A1 | 2/2013 | Huang et al. | |
| 2013/0175616 A1 * | 7/2013 | Min | H01L 29/063 257/339 |
| 2013/0292764 A1 | 11/2013 | Yang et al. | |

(Continued)

OTHER PUBLICATIONS

USPTO, Advisory Action Before the Filing of an Appeal Brief for U.S. Appl. No. 13/606,797, mailed Dec. 26, 2014.

(Continued)

*Primary Examiner* — Lex Malsawma

(57) ABSTRACT

Semiconductor device structures and related fabrication methods are provided. An exemplary semiconductor device structure includes a first region of semiconductor material having a first conductivity type and a first dopant concentration, a second region of semiconductor material having a second conductivity type overlying the first region, a drift region of semiconductor material having the first conductivity type overlying the second region, and a drain region of semiconductor material having the first conductivity type. The drift region and the drain region are electrically connected, with at least a portion of the drift region residing between the drain region and the second region, and at least a portion of the second region residing between that drift region and the first region. In one or more exemplary embodiments, the first region abuts an underlying insulating layer of dielectric material.

19 Claims, 7 Drawing Sheets

(56) References Cited

U.S. PATENT DOCUMENTS

2014/0070311 A1 3/2014 Yang et al.
2014/0070312 A1 3/2014 Yang et al.

OTHER PUBLICATIONS

USPTO, Final Office Action for U.S. Appl. No. 13/606,797, mailed Oct. 3, 2014.
USPTO, Non-Final Office Action for U.S. Appl. No. 13/606,797, mailed Mar. 10, 2014.
Adrian W. Ludikhuize, "A Review of RESURF Technology", the 12th International Symposium on Power Semiconductor Devices and ICs (ISPSD'2000), Copyright 2000 by the IEEE, Catalog No. 00CH37094C.
Piet Wessels, "Power Devices on SOI," MIGAS, Jun. 22, 2009.
USPTO, Response to Office Action for U.S. Appl. No. 13/606,797, mailed Jun. 9, 2014.
USPTO, Notice of Allowance and Fee(s) Due for U.S. Appl. No. 13/606,438, mailed Feb. 7, 2014.
I. Bertrand et al., "New lateral DMOS and IGBT structures realized on a partial SOI substrate based on LEGO process," IEEE BCTM 5.2 Conference Publication, pp. 74-77 (2005).
Remy Charavel et al., "N-Sinker formation by Phosphorous Silicon Glass Diffusion," 14th annual conference, ON Semiconductor Technical Paper, pp. 1-5 (2011).
USPTO, Office Action for U.S. Appl. No. 13/606,438, mailed Oct. 9, 2013.
USPTO, Notice of Allowance and Fee(s) Due for U.S. Appl. No. 13/606,797, mailed Mar. 18, 2015.
USPTO, Response to Office Action for U.S. Appl. No. 13/606,797, mailed Feb. 3, 2015.
USPTO, Notice of Allowance and Fee(s) Due for U.S. Appl. No. 14/548,616 mailed Dec. 3, 2015.

\* cited by examiner

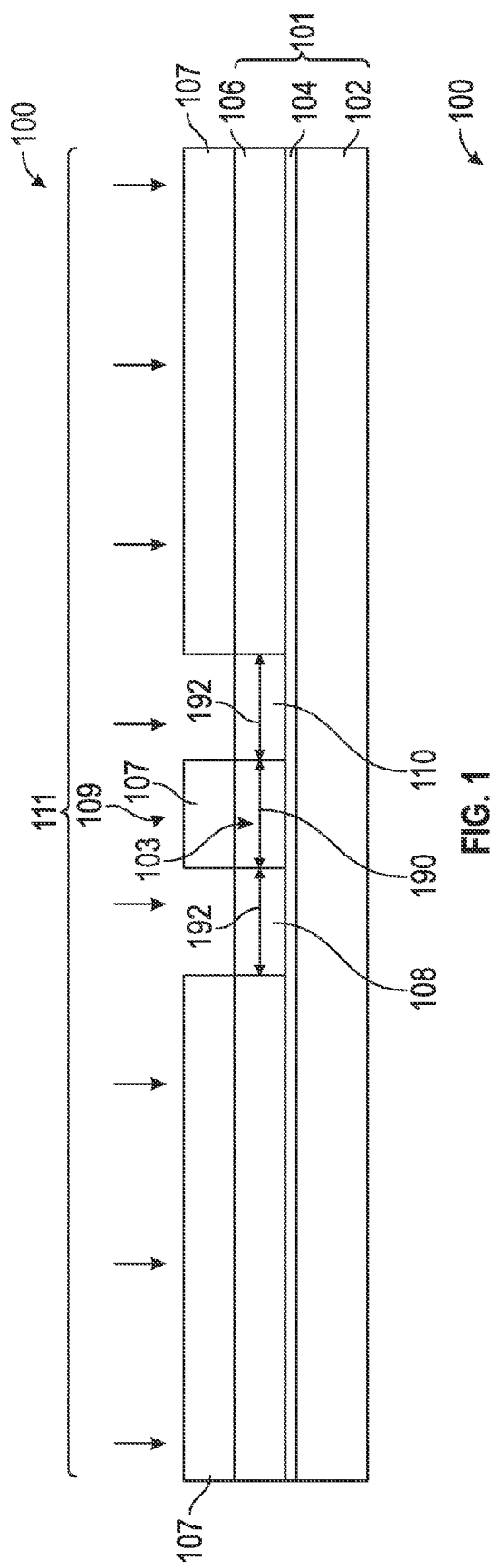
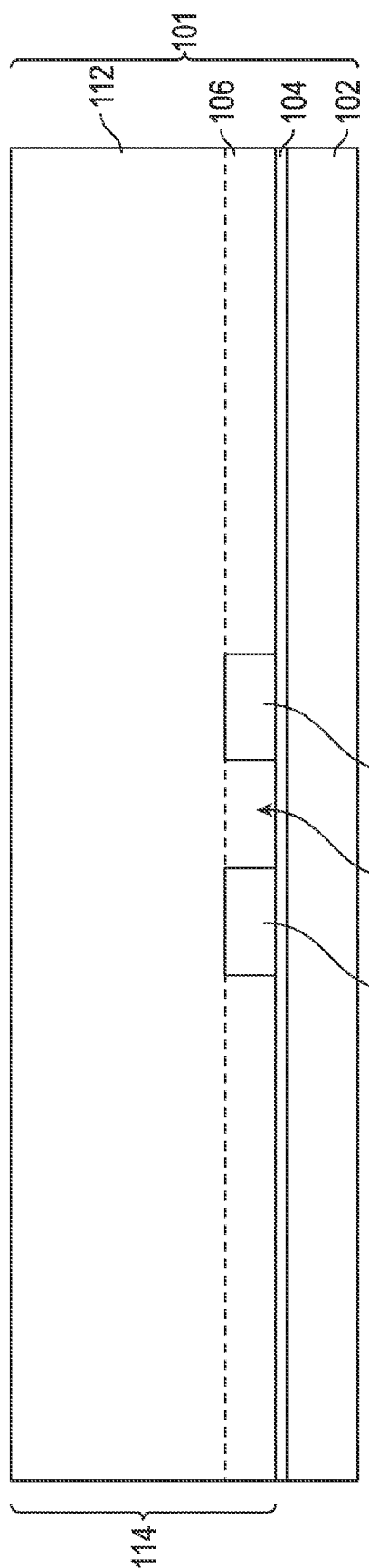
FIG. 1
FIG. 2

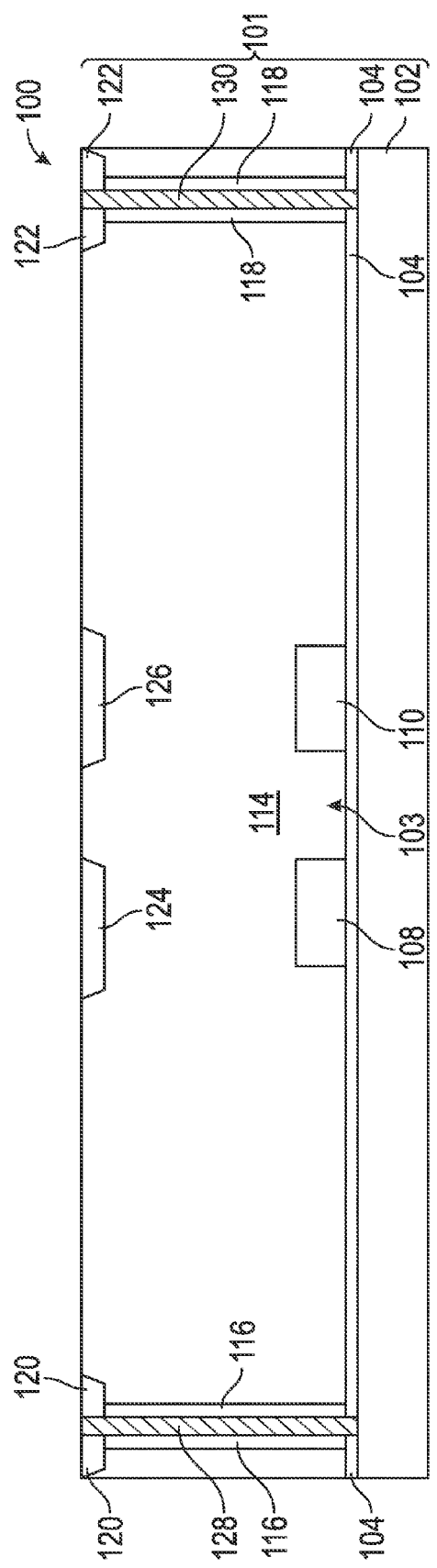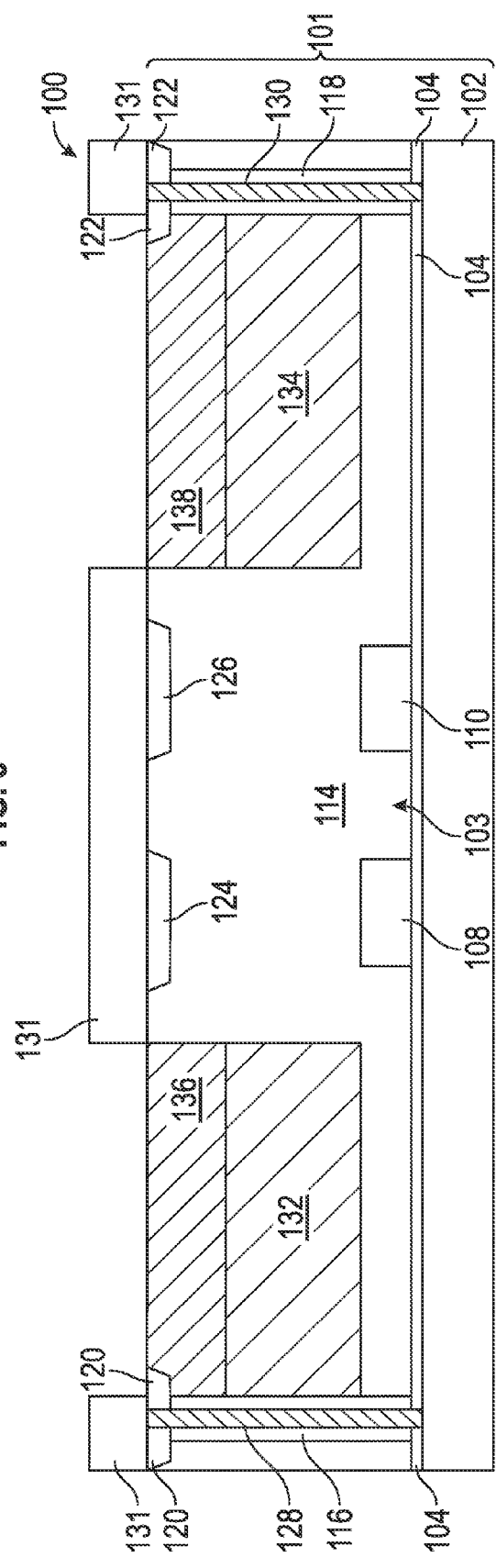

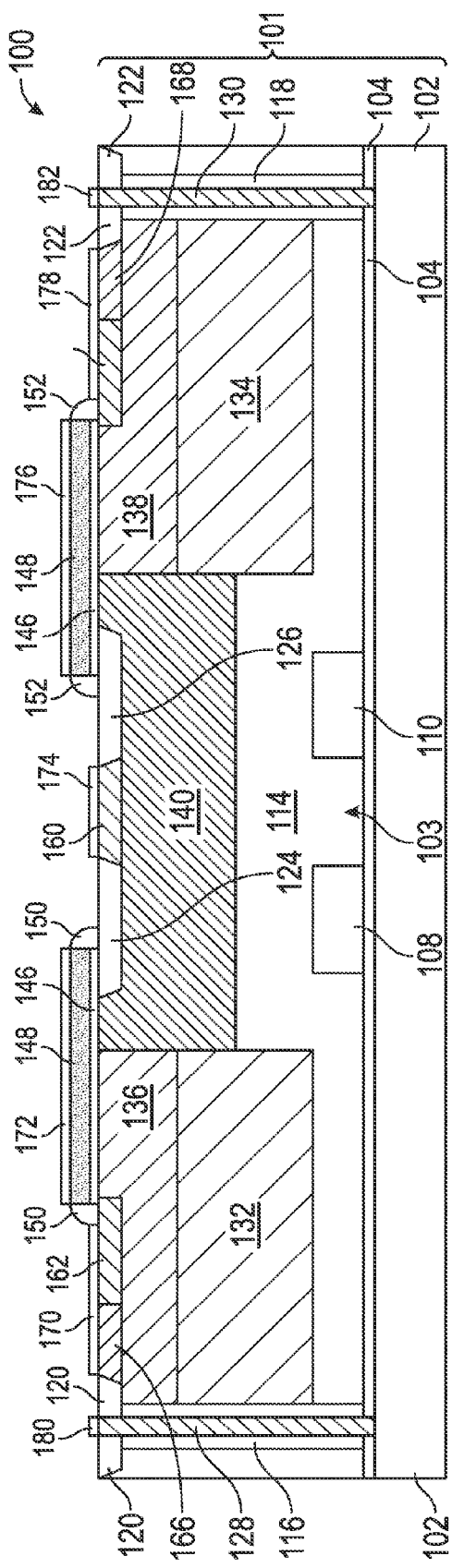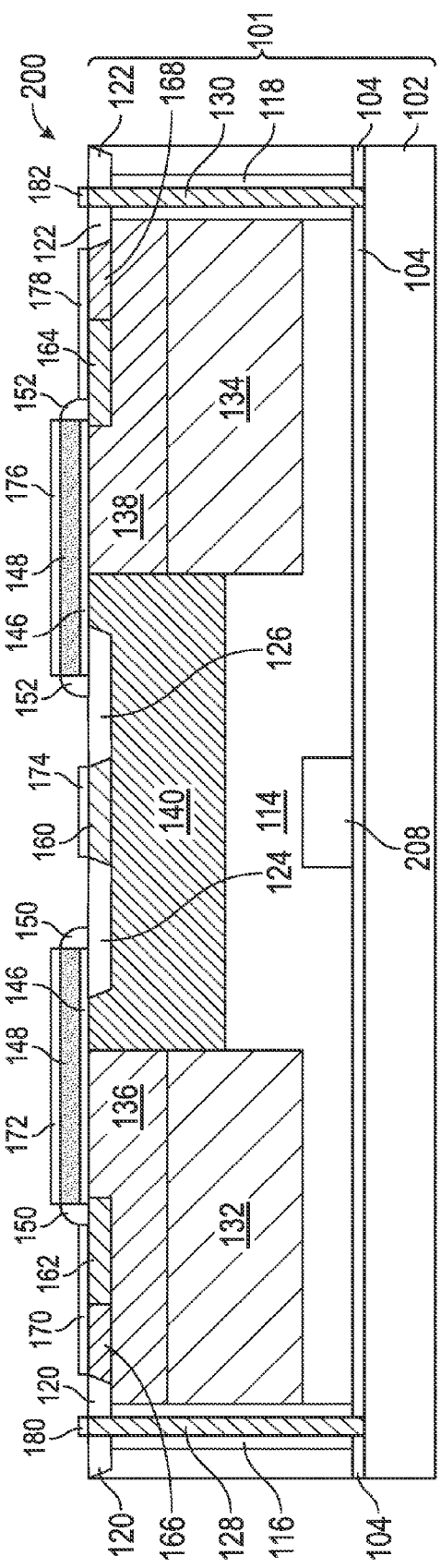

SEMICONDUCTOR DEVICE WITH IMPROVED BREAKDOWN VOLTAGE

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased breakdown voltage.

BACKGROUND

During normal operation, the voltage applied to a semiconductor device is constrained by the breakdown voltage of the device, which is the minimum applied voltage that causes avalanche breakdown in the device. For example, the rated drain-to-source voltage of transistor devices is typically set to a value that is well below the drain-to-source voltage that causes avalanche breakdown in the device to provide sufficient margin that accommodates a relatively large safe operation region, manufacturing variations or transient voltage fluctuations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIGS. 1-9 illustrate, in cross section, a semiconductor device structure and exemplary methods for fabricating the semiconductor device in accordance with one or more embodiments of the invention; and FIG. 10 illustrates, in cross section, a semiconductor device structure in accordance with one or more alternative embodiments of the invention.

DETAILED DESCRIPTION

Figure 5:
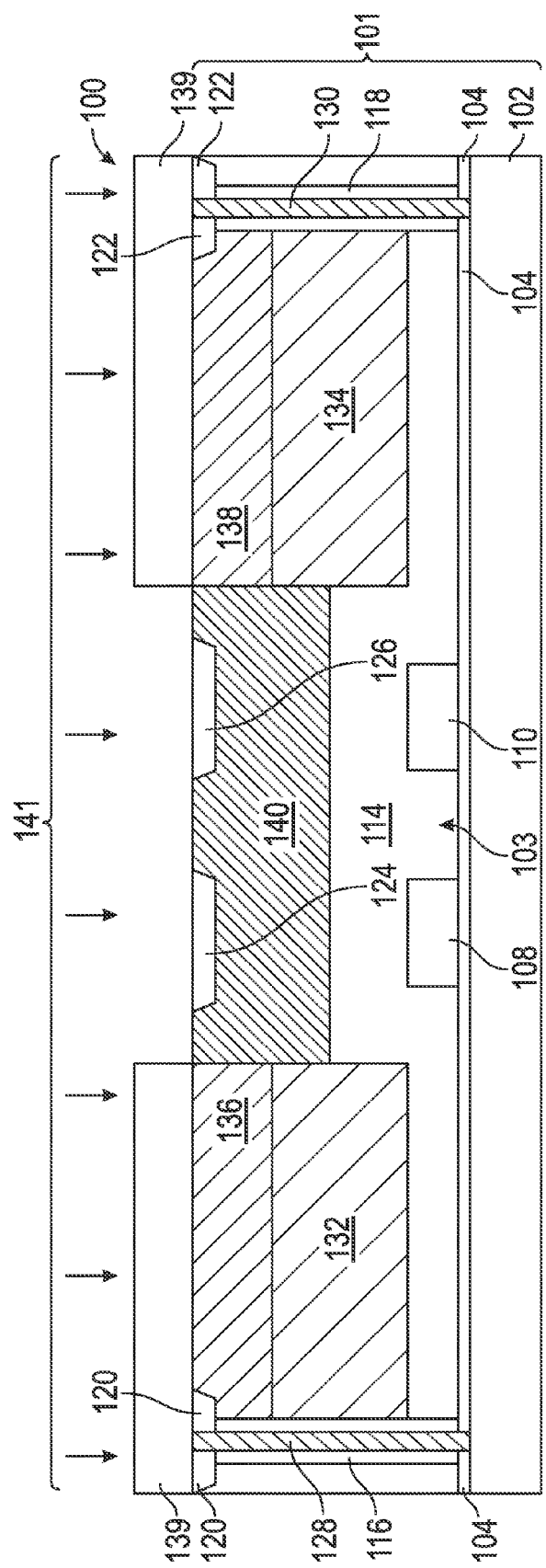

In practice, efforts to decrease transistor size or minimize on-resistance may lower the breakdown voltage, and thereby, reduce the margin (or voltage difference) between the rated drain-to-source voltage and the breakdown voltage. Thus, it is desirable to increase the breakdown voltage of transistor devices while decreasing transistor size or minimizing on-resistance in order to accommodate a higher rated drain-to-source voltage or otherwise increase the margin, and thereby relax design windows or manufacturing requirements. Accordingly, embodiments of the present invention distribute the drain voltage vertically to increase or otherwise improve the drain-to-source breakdown voltage. In this regard, in practice, some devices experience breakdown vertically within the semiconductor material before lateral breakdown between the drain and source occurs, and thus, increasing the vertical breakdown voltage improves the rated drain-to-source breakdown voltage (BVDSS).

FIGS. 1-9 illustrate, in cross-section, methods for fabricating a semiconductor device structure 100 in accordance with exemplary embodiments of the present invention. In exemplary embodiments, the semiconductor device structure 100 includes a laterally diffused metal oxide semiconductor (LDMOS) field-effect transistor structure that is fabricated on a silicon-on-insulator (SOI) substrate 101. The SOI substrate 101 includes a doped region 108, 110 having the same conductivity as a drain region 160 that overlies an insulating layer 104. The doped region 108, 110 underlies a lateral drift region 140 to provide a reduced surface field (RESURF) device. As used herein, a "drift region" should be understood as referring to a doped region of semiconductor material between a relatively higher doped drain region (or drain electrode contact region) and a channel region of a transistor device. The drift region supports the voltage bias at the drain region by distributing or otherwise dissipating the voltage (or electrical potential) of the drain region throughout the drift region. The drift region also provides a conductive path for current between the channel region and the drain region.

Although "MOS" properly refers to a device having a metal gate electrode and an oxide gate insulator, the subject matter may be utilized with any semiconductor device that includes a conductive gate electrode (whether metal or other conductive material) positioned with respect to a gate insulator (whether oxide or other insulator) positioned with respect to a semiconductor substrate to implement a field-effect transistor. The invention is not intended to be limited to a metal gate electrode and an oxide gate insulator. Furthermore, it should be appreciated that although the subject matter may be described herein in the context of an N-type (or N-channel) device, the subject matter is not intended to be limited to N-type devices and may be implemented in an equivalent manner for a P-type (or P-channel) device (e.g., by interchanging the conductivities of the doped regions). Various steps in the manufacture of MOS devices are well known and so, in the interest of brevity, many conventional steps will only be mentioned briefly herein or will be omitted entirely without providing the well-known process details. Moreover, although the subject matter is described herein in the context of forming the LDMOS transistor in epitaxial silicon, the subject matter is not limited to epitaxial silicon and an equivalent LDMOS transistor structure may be fabricated on bulk semiconductor material or other non-epitaxial semiconductor material in an appropriate manner.

As best illustrated in FIG. 9, the doped region 108, 110 that underlies the drift region 140 is buried underneath or otherwise underlies an intermediate region having the opposite conductivity, with the lateral positioning of the buried doped region 108, 110 being proximate to the drain 160. The buried doped region 108, 110 underlies a portion of the intermediate region 114 vertically disposed between the buried doped region 108, 110 and the lateral drift region 140. The buried doped region 108, 110 is laterally positioned near the more heavily doped drain region 160 without actually underlying the drain region 160 to provide a double RESURF device. In alternative embodiments, a buried doped region 208 may be vertically aligned with the drain region 160 such that at least a portion of the doped region 208 underlies the drain region 160, as depicted in FIG. 10. In exemplary embodiments, the buried doped regions 108, 110, 208 abut the insulating layer 104 of the SOI substrate 101. The buried doped region 108, 110 vertically distributes the drain voltage underneath the lateral drift region 140 towards the insulating layer 104 and reduces the percentage of the drain voltage that is vertically distributed between drain region 160 and upper surface of the portion of the insulating layer 104 underlying the drain region 160. The insulating layer 104 provides a capacitance capable of distributing the drain voltage vertically. Thus, by reducing the percentage of the drain voltage that is vertically distributed by the active semiconductor material 114, the percentage of the drain voltage that is vertically supported by (or distributed across) the capacitance provided by the insulating layer 104 is increased. Accordingly, the vertical breakdown voltage (e.g., between the drain region 160 and the underlying insulating layer 104) of the LDMOS transistor device is increased.

It should be noted that in some embodiments, the semiconductor device structure 100 may be rectangular, square, or circular in shape or otherwise formed so that the regions depicted as being separate in the cross-sections of FIGS. 1-9 may be integral or otherwise continuous, as will be appreciated in the art. For example, the drift region 140, drain region 160 and drain contact 174 may be located substantially at the center of the semiconductor device structure 100 with the remaining regions of the semiconductor device structure 100 being disposed about the drain. In such embodiments, the buried regions 108, 110 may be integral or contiguous, the body well regions 136, 138 may be integral or contiguous, the gate structures 142, 144 may be integral or contiguous, and so on. In this regard, while FIGS. 1-9 depict two doped regions 108, 110 in the cross-sectional view, in practice, the two doped regions 108, 110 may be realized as portions of a contiguous or continuous annular doped region.

Referring to FIG. 1, in exemplary embodiments, fabrication of the semiconductor device structure 100 begins by providing or obtaining a SOI substrate 101 having a support (or handle) layer 102 of semiconductor material, an insulating layer 104 of dielectric material on or overlying the support layer 102, and a layer 106 of semiconductor material on or overlying the insulating layer 104. As described in greater detail below, in exemplary embodiments, the layer 106 of semiconductor material is utilized to epitaxially grow additional semiconductor material for subsequently fabricating one or more transistor devices thereon, and accordingly, for convenience, but without limitation, the layer 106 of semiconductor material may alternatively be referred to herein as the seed layer. In an exemplary embodiment, the semiconductor material of each of the layers 102, 106 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 102, 106 may be realized as germanium, gallium arsenide, and the like, or one or more of the layers 102, 106 may include layers of different semiconductor materials.

In accordance with one embodiment, the insulating layer 104 is realized as an oxide layer formed in a subsurface region of the semiconductor substrate 101, also known as a buried oxide (BOX) layer. For example, the buried oxide layer 104 may be formed by oxidizing a wafer of semiconductor material (e.g., seed layer 106) which is then bonded to the support layer 102 to provide the buried layer 104 of oxide material between the support layer 102 and the seed layer 106. In exemplary embodiments, the support layer 102 and the seed layer 106 are each lightly doped. For example, for an N-type device, the seed layer 106 may be realized as a P-type silicon material having a P-type dopant concentration (e.g., boron ions or a boron ionized species) in the range of about $1\times10^{13}/\text{cm}^3$ to about $1\times10^{17}/\text{cm}^3$. Similarly, the support layer 102 may also be doped with the same (or different) conductivity-determining impurity type as the seed layer 106. It should be understood that the fabrication process described herein is not constrained by the substrate of semiconductor material utilized, and the fabrication process described herein may also be used to create devices from a bulk semiconductor substrate.

In exemplary embodiments, doped regions 108, 110 having a conductivity type that is opposite the conductivity of the seed layer 106 are formed within the seed layer 106. As described in greater detail below, the doped regions 108, 110 underlie a lateral drift region proximate the drain of the subsequently formed transistor structure to increase the vertical distribution of the drain voltage, and thereby increase the breakdown voltage by reducing the voltage at the p-n junction between the drain region 160 and the underlying insulating layer 104. In an exemplary embodiment, the doped regions 108, 110 are formed by masking the semiconductor device structure 100 with an implantation mask 107 that is patterned to expose the underlying regions of the seed layer 106 to be used for the subsequently formed doped regions 108, 110. In the embodiment of FIGS. 1-9, an interior portion 109 of the implantation mask 107 remains intact to mask an interior portion 103 of the seed layer 106 that will underlie the drain of the transistor structure. As described above, while FIGS. 1-9 depict two doped regions 108, 110 in the cross-sectional view, the doped regions 108, 110 may be realized as portions of a contiguous or continuous annular doped region that abuts and laterally circumscribes or otherwise surrounds the interior portion 103 of the seed layer 106.

After forming the implantation mask 107, the doped regions 108, 110 are then formed by implanting ions of the conductivity-determining impurity type opposite the conductivity of the seed layer 106, illustrated by arrows 111, in the exposed seed layer 106. In exemplary embodiments, the ions are implanted with a dopant concentration that is between $1\times10^{14}/\text{cm}^3$ to about $2\times10^{15}/\text{cm}^3$. The ions may be implanted at an energy level of in the range of about 1 megaelectron volt (MeV) to about 2 MeV to provide the doped regions 108, 110 having a depth or thickness (after subsequent thermal annealing and any other diffusion) that is equal to the thickness of the seed layer 106. For example, in accordance with one embodiment, for an N-channel semiconductor device having a P-type seed layer 106 with a thickness in the range of about 0.3 microns to about 0.5 microns, the doped regions 108, 110 are formed by implanting N-type ions (e.g., phosphorous ions or a phosphorous ionized species) with a dopant concentration of about $1\times10^{15}/\text{cm}^3$ and an energy level of about 1.5 MeV to provide doped regions 108, 110 having a depth equal to the thickness of the seed layer 106. In this regard, the lower boundaries of the doped regions 108, 110 abut the insulating layer 104. In some embodiments, the doped regions 108, 110 are formed concurrently to a light N-type barrier layer (LNBL) in other device regions of the semiconductor substrate 101 (e.g., the same ion implantation 111 is used to form the LNBL).

The separation distance 190 (or spacing) between the interior boundaries of the doped regions 108, 110 (or alternatively, the width of the interior portion 103) is greater than or equal to the width of the drain region 160 subsequently formed overlying the interior portion 103. In this regard, the internal lateral boundaries of the doped regions 108, 110 are vertically aligned with or outwardly offset from the external lateral boundaries of the subsequently-formed overlying drain region 160. For example, in exemplary embodiments, the separation distance 190 between the doped regions 108, 110 is in the range of about 1.5 microns to about 2 microns to accommodate an overlying drain region 160 having a width in the range of about 1.5 microns or less. In exemplary embodiments, the width 192 of the doped regions 108, 110 is less than 1.5 microns (typically about 1 micron). A relatively narrow width 192 concentrates the vertical distribution of the drain voltage provided by the buried regions 108, 110 at or near the portions of the insulating layer 104 proximate to or underlying the drain region 160, and thereby minimizes lateral distribution of the drain voltage by the buried regions 108, 110. In exemplary embodiments, the outer lateral boundaries of the doped regions 108, 110 do not extend laterally beyond the lateral boundaries of the subsequently-formed lateral drift region 140 so that portions of the doped regions 108, 110 do not underlie subsequently-formed body well regions 136, 138. Thus, portions of the seed layer 106 adjacent to the peripheral lateral boundaries of the doped regions 108, 110 may underlie portions of the lateral drift region 140 that extend laterally from the subsequently-formed drain region 160 to the subsequently-formed body well regions 136, 138. In exemplary embodiments, the lateral dimension 192 of the buried regions 108, 110 is about twenty percent of the lateral dimension of the lateral drift region 140 or less. For example, the lateral drift region 140 may have a width of about 5 microns while the width of the buried regions 108, 110 is about 1 micron.

Referring now to FIG. 2, in exemplary embodiments, the fabrication process continues by forming or otherwise providing an epitaxial layer 112 of semiconductor material on the seed layer 106 to provide an active region 114 of semiconductor material having a desired thickness and conductivity, resulting in the semiconductor device structure 100 illustrated in FIG. 2. In accordance with one or more embodiments, for an N-type device, the epitaxial layer 112 is formed by epitaxially growing silicon material on the seed layer 106 and in-situ doping the silicon material by adding boron ions (or other P-type ions) to the reactants used to epitaxially grow the layer 112. In one or more embodiments, for an N-type device, the epitaxial layer 112 has a P-type dopant concentration (e.g., boron ions or a boron ionized species) in the range of about $1 \times 10^{13}/cm^3$ to about $4 \times 10^{15}/cm^3$. The epitaxial layer 112 may be grown to a thickness such that a total thickness of the active region 114 (e.g., the sum of the thickness of the seed layer 106 and the epitaxial layer 112) is in the range of about one micron (or micrometers) to about 10 microns. It will be appreciated that the total thickness of the active region 114 may vary depending on the needs of a particular application. In one or more embodiments, the dopant concentration of the epitaxial layer 112 may be substantially equal to the dopant concentration of the seed layer 106 (e.g., on the same order of magnitude). For convenience and ease of explanation, the seed layer 106 and the epitaxial layer 112 may collectively be referred to herein as the active region 114 of substrate semiconductor material. Additionally, for an N-type device, the P-type active region 114 functions as a lightly doped portion of the body, and thus, the active region 114 (or portions thereof) may alternatively be referred to as a lightly doped body region. As illustrated, at least a portion of the active region 114 overlies the doped regions 108, 110, such that the doped regions 108, 110 underlie semiconductor material having the opposite conductivity type. Accordingly, for purposes of explanation, the doped regions 108, 110 may alternatively be referred to herein as buried doped regions.

Referring now to FIG. 3, in the illustrated embodiment, the fabrication process continues by forming isolation regions in the active region 114 of semiconductor material. In an exemplary embodiment, the fabrication process isolates the transistor device subsequently formed on the active region 114 from adjacent semiconductor devices by performing deep trench isolation (DTI) to provide deep isolation regions 116, 118 of dielectric material. After forming deep isolation regions 116, 118, the fabrication process may continue by forming shallow isolation regions 120, 122, 124, 126 of a dielectric material by performing shallow trench isolation (STI). In exemplary embodiments, the depth of the shallow isolation regions 120, 122, 124, 126 is less than the depth (or thickness) of the subsequently-formed lateral drift region 140. In the illustrated embodiment, the fabrication process forms conductive (or semiconductive) contacts 128, 130 to the support layer 102 through interior portions of the isolation regions 116, 118, 124, 126. The conductive contacts 128, 130 may be utilized to bias the support layer 102 to a desired electrical potential (e.g., electrical ground), as described in greater detail below.

Referring now to FIG. 4, in exemplary embodiments, the fabrication process continues by forming doped enhancement regions 132, 134 of semiconductor material within the active region 114. For purposes of explanation, in the embodiments described herein, the enhancement regions 132, 134 are realized as body enhancement regions having the same conductivity type as the active region 114. The body enhancement regions 132, 134 reduce the likelihood of turning on a parasitic bipolar junction transistor within the semiconductor device structure and facilitate a larger safe operation region (or safe operating area). However, in alternative embodiments, the enhancement regions 132, 134 may be realized as vertical drain voltage enhancement regions having the opposite conductivity type as the active region 114 and the same conductivity type as the drain and/or buried regions 108, 110.

In an exemplary embodiment, the body enhancement regions 132, 134 are formed by masking the semiconductor device structure 100 with an implantation mask 131 that is patterned to expose the underlying portions of the active region 114 to be used for the subsequently formed body regions. The body enhancement regions 132, 134 are then formed by implanting ions of the same conductivity-determining impurity type as the active region 114 in the active region 114 with a dopant concentration that is greater than the dopant concentration of the active region 114. The ions may be implanted at an energy level of in the range of about 0.3 megaelectron volt (MeV) to about 2 MeV to provide the enhancement regions 132, 134 having a depth (after subsequent thermal annealing and any other diffusion) that is greater than the depth of body regions subsequently formed in the enhancement regions 132, 134. At the same time, the depth of the enhancement regions 132, 134 is less than the thickness of the active region 114. For example, in accordance with one embodiment, for an N-channel semiconductor device, body enhancement regions 132, 134 are formed by implanting P-type ions (e.g., boron ions) with a dopant concentration of about $5 \times 10^{16}/cm^3$ and an energy level of about 2 MeV to provide enhancement regions 132, 134 having a depth in the range of about 1.0 microns to about 2.0 microns relative to the surface of the active region 114.

In the illustrated embodiment, the fabrication process continues by forming more heavily doped body well regions 136, 138 of semiconductor material within the enhancement regions 132, 134. In an exemplary embodiment, the body well regions 136, 138 are formed using the same implantation mask 131 that was used for the enhancement regions 132, 134. The body well regions 136, 138 are formed by implanting ions of the same conductivity-determining impurity type in the enhancement regions 132, 134 with a dopant concentration that is greater than the dopant concentration of the enhancement regions 132, 134. The ions may be implanted at an energy level in the range of about 20 kiloelectron volts (keV) to about 300 keV to provide the body well regions 136, 138 having a depth (after subsequent thermal annealing and any other diffusion) that is less than the depth of the enhancement regions 132, 134. For example, in accordance with one embodiment, for an N-channel semiconductor device, body well regions 136, 138 are formed by implanting P-type ions with a dopant concentration in the range of about $5 \times 10^{16}/cm^3$ to about $5 \times 10^{17}/cm^3$ in a series of one or more implants having energy levels in the range of about 20 keV to about 300 keV to provide body well regions 136, 138 having a depth in the range of about 1 micron to about 1.5 microns relative to the surface of the active region 114. In this regard, the dopant concentration of the body well regions 136, 138 may be greater than the dopant concentration of the enhancement regions 132, 134, with the depth (or extent of diffusion) of the enhancement regions 132, 134 being greater than the depth (or extent of diffusion) of the body well regions 136, 138 by virtue of the higher energy level used for the enhancement region implants.

Turning now to FIG. 5, in exemplary embodiments, the fabrication process continues by forming a doped region 140 of semiconductor material within the active region 114 having the same conductivity as the buried doped regions 108, 110. As described in greater detail below, the doped region 140 functions as a lateral drift region between the drain electrode and the conductive channel of the subsequently formed transistor structure, and accordingly, the region 140 may alternatively be referred to herein as the lateral drift region.

In the illustrated embodiment, the lateral drift region 140 is formed by masking the body well regions 136, 138 of the semiconductor device structure 100 with an implantation mask 139 that is patterned to expose the interior portion of the active region 114 between the body well regions 136, 138. The lateral drift region 140 is then formed by implanting ions of the same conductivity-determining impurity type as the buried regions 108, 110 (and opposite to the body well regions 136, 138), illustrated by arrows 141. The ions are implanted 141 in the active region 114 at an energy level less than the energy level used for the body well regions 136, 138 to provide the lateral drift region 140 having a depth less than the thickness of the epitaxial layer 112. In the illustrated embodiment, at least a portion of the active region 114 resides vertically between the lower boundary of the lateral drift region 140 and the upper boundaries of the buried regions 108, 110. For example, in accordance with one embodiment, for an N-channel semiconductor device, the lateral drift region 140 is formed by implanting N-type ions with a dopant concentration in the range of about $1 \times 10^{15}/cm^3$ to about $5 \times 10^{16}/cm^3$ (typically about $2 \times 10^{16}/cm^3$) in a series of one or more implants having energy levels in the range of about 50 keV to about 1000 keV to provide the lateral drift region 140 having a depth in the range of about 1 microns to about 2 microns relative to the surface of the active region 114. In this regard, a lower portion of the lateral drift region 140 may extend deeper than the lower boundaries of the body well regions 136, 138. By virtue of the buried doped regions 108, 110 underlying the lateral drift region 140 distributing the drain voltage vertically, a reduced electrical field is achieved at the vertical p-n junctions between the drift region 140 and the body well regions 136, 138 (as well as at the junctions between the drift region 140 and the body enhancement regions 132, 134), thereby improving the breakdown voltage. It should be noted that although FIGS. 5-10 depict a substantially uniform lateral drift region 140, in alternative embodiments, the drift region may be comprised of multiple different dopant implant profiles having varying depths and/or dopant concentrations.

Figure 6:
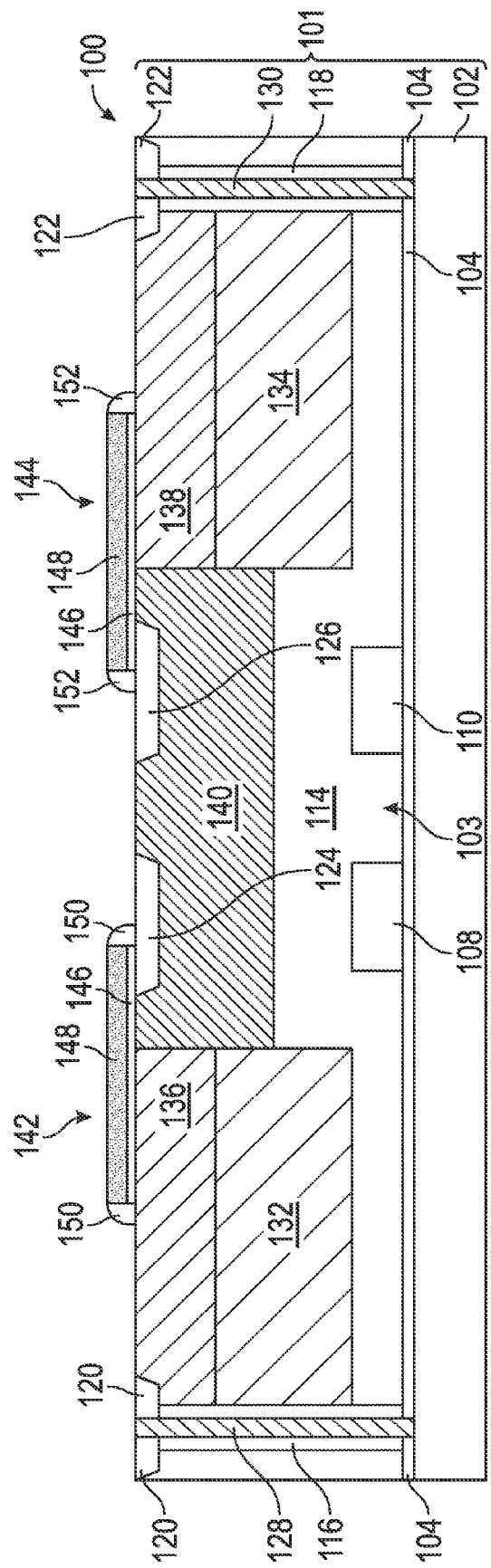

Turning now to FIG. 6, after forming the lateral drift region 140, the illustrated fabrication process continues by removing the implantation mask 139 and fabricating a plurality of gate structures 142, 144 overlying the active region 114. The gate structures 142, 144 overlie the vertical p-n junction between the lateral drift region 140 and the body well regions 136, 138, and the illustrated gate structures 142, 144 each include a flap portion that overlaps or otherwise overlies at least a portion of respective isolation region 124, 126. A first gate structure 142 overlies at least a portion of the isolation region 124, an interior portion of the body well region 136, and the portion of the drift region 140 disposed between the isolation region 124 and the body well region 136. Similarly, the second gate structure 144 overlies at least a portion of the isolation region 126, an interior portion of body well region 138, and the portion of the drift region 140 disposed between the isolation region 126 and the body well region 138. In exemplary embodiments, the first gate structure 142 and the second gate structure 144 are electrically connected so that they have the same electrical potential and collectively function as the conductive gate electrode for the subsequently formed LDMOS transistor structure. By virtue of the flap portions of the gate structures 142, 144 overlying the isolation regions 124, 126 formed in the lateral drift region 140, the upper surfaces of the isolation regions 124, 126 are biased to the gate voltage.

In exemplary embodiments, the gate structures 142, 144 are formed by forming one or more layers of dielectric material 146 overlying the semiconductor device structure 100, forming one or more layers of conductive (or semiconductive) material 148 overlying the dielectric material 146, and etching the layers of materials 146, 148 to define the gate structures 142, 144. In this regard, the conductive material 148 functions as the conductive gate electrode material of the gate electrode structure 142 and the underlying portion of dielectric material 146 functions as the gate insulator. In accordance with one or more embodiments, the dielectric material 146 is realized as an oxide material that is formed by oxidizing the exposed surfaces of the active region 114 to a thickness of about 7 nanometers (nm) to about 35 nm. After the dielectric material 146 is formed, the conductive material 148 may be formed by conformably depositing a conductive material, such as a polycrystalline silicon material, by chemical vapor deposition (CVD) or another suitable deposition process to a thickness of about 100 nm to about 350 nm. After the conductive material 148 is formed, fabrication of the gate structures 142, 144 may be completed by masking the portions of the materials 146, 148 to be utilized for the gate structures 142, 144 and etching the exposed portions of materials 146, 148 using an anisotropic etchant. In the illustrated embodiment, sidewall spacers 150, 152 are formed about the sidewalls of the gate structures 142, 144 in a conventional manner, for example, by conformally depositing a layer of nitride material overlying the semiconductor device structure 100 and anisotropically etching the nitride material to remove the nitride material on top of the gate structures 142, 144.

Figure 7:
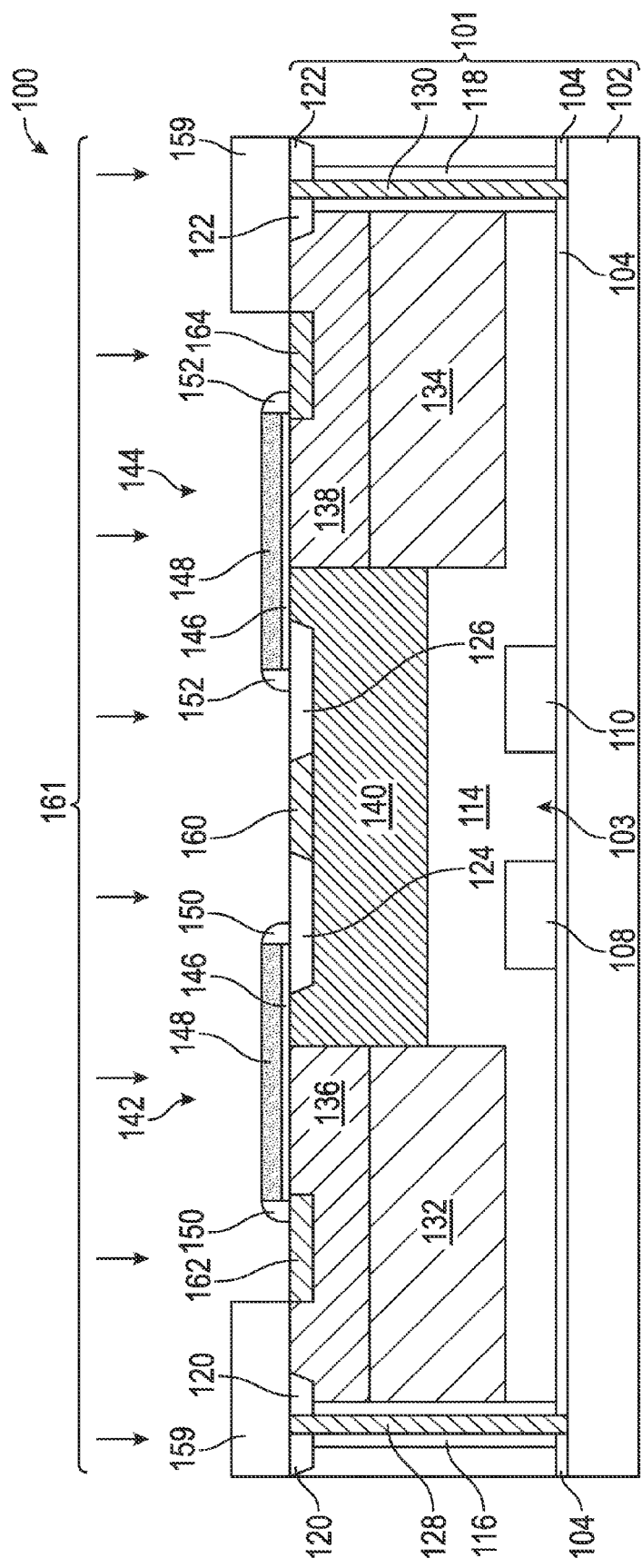
Figure 8:
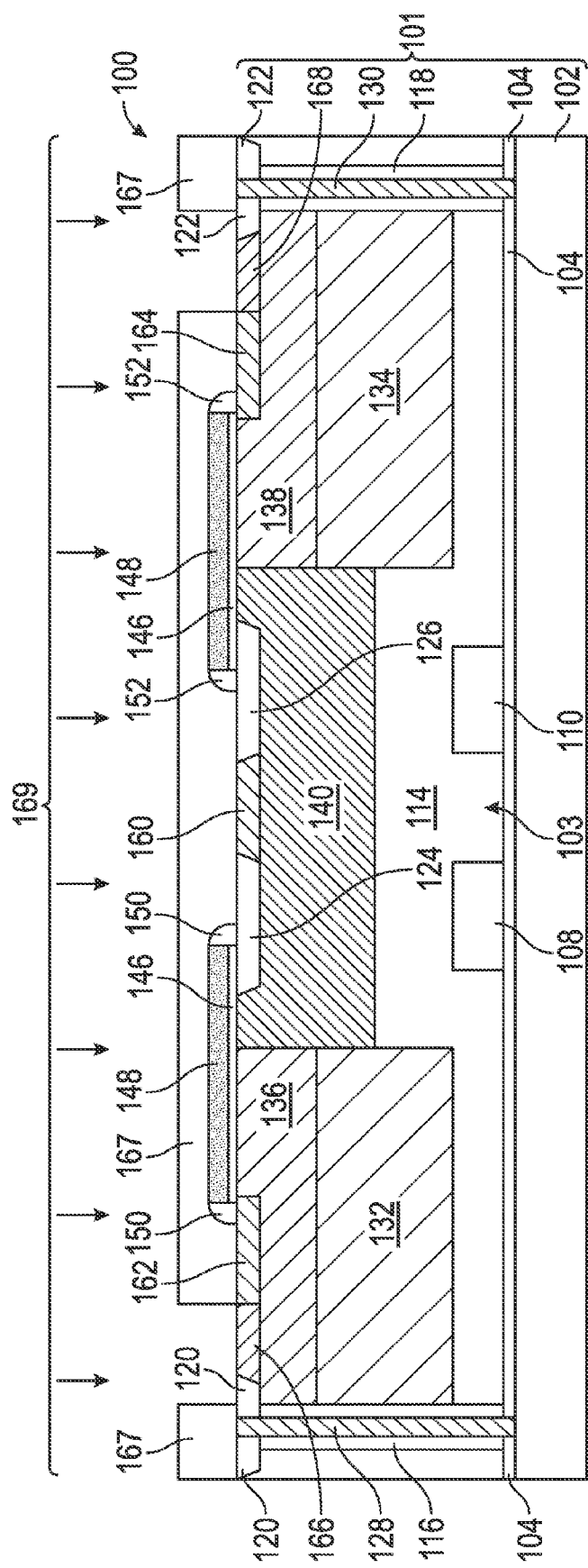

Turning now to FIGS. 7-8, after forming gate structures 142, 144, fabrication of the semiconductor device structure 100 continues by forming doped electrode contact regions 160, 162, 164, 166, 168 for subsequently forming electrical connections between the semiconductor device structure and external circuitry. In this regard, the contact regions 160, 162, 164, 166, 168 are relatively heavily doped such that they have low resistivity. As illustrated in FIG. 7, in an exemplary embodiment, a drain contact region 160 is formed in the lateral drift region 140 and source contact regions 162, 164 are formed in the body well regions 136, 138 proximate the gate electrode structures 142, 144. The semiconductor device structure 100 is masked with an implantation mask 159 that masks portions of the body well regions 136, 138 proximate the isolation regions 124, 126 and leaves exposed the remaining portions of the active region 114 to be used for the drain/source contact regions 160, 162, 164. Additionally, the implantation mask 159 may also be patterned to expose the gate structures 142, 144 so that the gate structures 142, 144 are concurrently doped during the ion implantation step used to form the drain/source contact regions 160, 162, 164. It should be noted that in alternative embodiments, the drain/source contact regions 160, 162, 164 may be formed with separate ion implantations steps and/or differing dopant concentrations. For example, laterally diffused source extension regions may be formed to extend further underneath the gate structures 142, 144 prior to forming the source regions 162, 164.

The drain/source contact regions 160, 162, 164 are formed by implanting ions of the same conductivity-determining impurity type as the lateral drift region 140, illustrated by arrows 161, in the exposed portions of the lateral drift region 140 and body well regions 136, 138 using the implantation mask 159, resulting in the semiconductor device structure 100 of FIG. 8. For example, in accordance with one embodiment, for an N-channel semiconductor device, the drain/source contact regions 160, 162, 164 are formed by implanting N-type ions, such as phosphorous ions or a phosphorous ionized species, with a dopant concentration in the range of about $1 \times 10^{19}/cm^3$ about $1 \times 10^{21}/cm^3$ at an energy level of about 30 keV. In this regard, the ion implantation energy level used for the drain/source contact regions 160, 162, 164 is less than the ion implantation energy level used for the body well regions 136, 138 such that the depth of the source regions 162, 164 is less than the depth of the body well regions 136, 138. The depth of the drain region 160 is also less than the depth of the isolation regions 124, 126. For example, in one embodiment, N-type ions are implanted with a dopant concentration of about $1 \times 10^{21}/cm^3$ at an energy level of about 30 keV to provide drain/source contact regions 160, 162, 164 having a depth of about 100 nm relative to the surface of the active region 114. It will be appreciated that the source contact regions 162, 164 function as the source (or source region) for the subsequently formed transistor structure, whereas the drain (or drain region) for the subsequently formed transistor structure includes the drain contact region 160 and the lateral drift region 140.

Turning now to FIG. 8, in the illustrated embodiment, after forming the drain/source contact regions 160, 162, 164, the fabrication process continues by removing the implantation mask 159 and forming body contact regions 166, 168 in the body well regions 136, 138 between a respective source contact region 162, 164 and a respective isolation region 124, 126. In this regard, the semiconductor device structure 100 is masked with an implantation mask 167 that masks the gate structures 142, 144 and the drain/source contact regions 160, 162, 164 and leaves exposed the remaining portions of the body well regions 136, 138. The body contact regions 166, 168 are formed by implanting ions of the same conductivity-determining impurity type as the body well regions 136, 138, illustrated by arrows 169, in the exposed portions of the body well regions 136, 138 using the implantation mask 167, resulting in the semiconductor device structure 100 of FIG. 8. For example, in accordance with one embodiment, for an N-channel semiconductor device, the body contact regions 166, 168 are formed by implanting P-type ions, such as boron ions or a boron ionized species, with a dopant concentration in the range of about $1 \times 10^{19}/cm^3$ to about $1 \times 10^{21}/cm^3$ at an energy level in the range of about 2 keV to about 6 keV. In this regard, the dopant concentration of the body contact regions 166, 168 is greater than the dopant concentration of the body well regions 136, 138 but the ion implantation energy level used for the body contact regions 166, 168 is less than the ion implantation energy level used for the body well regions 136, 138 such that the depth of the body contact regions 166, 168 is less than the depth of the body well regions 136, 138. For example, in one embodiment, boron ions or a boron ionized species are implanted with a dopant concentration of about $1 \times 10^{21}/cm^3$ at an energy level of about 5 keV to provide body contact regions 166, 168 having a depth of about 100 nm relative to the surface of the active region 114. In this regard, the depth and dopant concentration of the body contact regions 166, 168 may be substantially same as the depth and dopant concentration of the drain/source contact regions 160, 162, 164 but with the opposite conductivity.

Turning now to FIG. 9, in the illustrated embodiment, after the electrode contact regions 160, 162, 164, 166, 166, 168 are formed, fabrication of the transistor device continues by removing the implantation mask 167 and forming contacts 170, 172, 174, 176, 178, overlying the contact regions 160, 162, 164, 166 168 and the gate structures 142, 144. For example, the contacts 170, 172, 174, 176, 178 may be realized as silicide contacts that are formed in a conventional manner Contacts 180, 182 may also be concurrently formed overlying the conductive polysilicon contacts 128, 130 to the support layer 102.

In accordance with one or more embodiments, after forming silicide contacts, fabrication of the transistor device continues by forming appropriate electrical interfaces and/or electrical connections to/from the silicide contacts, for example, using subsequently formed interconnect layers overlying the semiconductor device structure 100. For example, the gate structures 142, 144 may be electrically connected, for example, by providing a conductive connection between the gate contacts 172, 176 so that the gate structures 142, 144 have the same voltage (or electrical potential). As illustrated in FIG. 9, in exemplary embodiments, each source contact region 162, 164 is electrically connected (or shorted) to its adjacent body contact region 166, 168 by its respective overlying contact 170, 178, such that the underlying body well regions 136, 138 are biased to the source voltage. The source regions 162, 164 may be electrically connected, for example, by providing a conductive connection between the source contacts 170, 178 so that the body well regions 136, 138 have the same voltage (or electrical potential). In exemplary embodiments, the support layer 102 is biased to a ground voltage, for example, by connecting or otherwise providing the ground voltage to the contacts 180, 182. In some embodiments, the source voltage may be the ground voltage, in which case the support layer contacts 180, 182 and the source contacts 170, 178 are electrically connected or otherwise shorted together to bias the support layer 102 to the source voltage.

Still referring to FIG. 9, the buried regions 108, 110 are floating, in that they are not directly connected to any device terminals or any other external circuitry that could ground or otherwise influence their electrical potential. The buried regions 108, 110 are also isolated from other regions having the same conductivity type by intervening portions of the active region 114 or the seed layer 106 that overlie or laterally circumscribe the buried regions 108, 110. The buried regions 108, 110 are N-type and collect electrons that would otherwise flow between the drift region 140 and the body well regions 136, 138. As the drain voltage applied to the N-type drain region 160 increases relative to the source voltage (e.g., the voltage applied to the source and/or body regions 162, 164, 166, 168), punch-through between the N-type drift region 140 and the N-type buried region 108, 110 will force the voltage of the N-type buried regions 108, 110 to increase proportionally. This, in turn, increases the percentage of the drain voltage that is vertically distributed or otherwise supported by the capacitance provided by the buried layer 104. The vertical breakdown voltage can thus be increased, which in turn, increases drain-to-source breakdown voltage (BVDSS) for the semiconductor device structure 100.

For the LDMOS device structure 100 illustrated in FIG. 9, at least a portion of the P-type active region 114 overlies the N-type buried regions 108, 110 and resides vertically between the buried regions 108, 110 and the N-type lateral drift region 140. Additionally, at least a portion of the N-type lateral drift region 140 resides vertically between the P-type active region 114 and the N-type drain region 160. In one or more embodiments, the buried regions 108, 110 do not underlie the drain region 160. In such embodiments, the interior portion 103 of the active region 114 or seed layer 106 underlies the drain region 160 and abuts the interior boundaries of the buried regions 108, 110. In this regard, the P-type interior portion 103 may be vertically aligned with the drain region 160 (e.g., the lateral boundaries of the interior portion 103 are substantially vertically aligned with lateral boundaries of the drain region 160), with the buried regions 108, 110 laterally circumscribing the interior portion 103 (and thereby the drain region 160). As described above, in exemplary embodiments, the lateral drift region 140 has a dopant concentration that is less than the dopant concentration of the drain region 160 but greater than the dopant concentration of the buried regions 108, 110 to support open drain functionality.

FIG. 10 depicts an alternative embodiment of a semiconductor device structure 200 that includes a single buried doped region 208 that is vertically aligned with the drain region 160. In this regard, the lateral boundaries of the buried doped region 208 may be substantially vertically aligned with the lateral boundaries of the drain region 160. The buried doped region 208 is laterally circumscribed or otherwise surrounded by portions of the seed layer 106 or active region 114 that underlie portions of the lateral drift region 140 that extend from the drain to a respective body well region 136, 138. In a similar manner as described above, the buried region 208 increases vertical distribution of the drain voltage. However, the semiconductor device structure 200 does not achieve the double RESURF effect achieved by the semiconductor device structure 100 of FIGS. 1-9, which results in the semiconductor device structure 100 of FIGS. 1-9 having a lower breakdown voltage than the semiconductor device structure 200 of FIG. 2.

For the sake of brevity, conventional techniques related to semiconductor and/or integrated circuit fabrication, power transistors, biasing, device breakdown, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, systems, devices, and methods configured in accordance with example embodiments of the invention relate to:

An apparatus for a semiconductor device structure is provided in one embodiment. The semiconductor device structure includes a first region of semiconductor material having a first conductivity type and a first dopant concentration, a second region of semiconductor material having a second conductivity type, the second region overlying the first region, a drift region of semiconductor material having the first conductivity type overlying the second region, at least a portion of the second region residing between the first region and the drift region, the drift region having a second dopant concentration, and a drain region of semiconductor material having the first conductivity type and a third dopant concentration. At least a portion of the drift region resides between the second region and the drain region, the first dopant concentration is less than or equal to the second dopant concentration, and the third dopant concentration is greater than the second dopant concentration. In one embodiment, the semiconductor device structure further comprises a layer of dielectric material, wherein the first region overlies the layer of dielectric material. In a further embodiment, the first region abuts the layer of dielectric material. In another embodiment, the semiconductor device structure further comprises a body region of semiconductor material having the second conductivity type, wherein the drift region comprises a lateral drift region that provides a path for current between the drain region and a channel within the body region. In another embodiment, a second portion of the second region underlies the drain region and abuts the first region. In further embodiments, the second portion of the second region resides laterally between portions of the first region, the drift region overlies the portions of the first region, and the portion of the second region resides vertically between the portions of the first region. In other embodiments, the first region circumscribes the second portion, wherein lateral boundaries of the second portion are substantially vertically aligned with lateral boundaries of the drain region. In yet another embodiment, the first region underlies the drain region, and in some embodiments, the first region and the drain region are vertically aligned.

In another embodiment, a semiconductor device structure comprises a buried region of semiconductor material having a first conductivity type, a first region of semiconductor material having a second conductivity type overlying the buried region, a drift region of semiconductor material having the first conductivity type overlying the first region, a drain region of semiconductor material having the first conductivity type within the drift region, the drain region having a dopant concentration greater than a dopant concentration of the drift region, wherein at least a portion of the drift region resides between the drain region and the first region, and at least a portion of the first region resides between the drift region and the buried region. In one embodiment, a dopant concentration of the buried region is less than the dopant concentration of the drift region. In another embodiment, the semiconductor device structure further comprises a layer of dielectric material, wherein the buried region overlies and abuts the layer of dielectric material. In another embodiment, the semiconductor device structure further comprises a body region of semiconductor material having the second conductivity type, wherein at least a second portion of the first region underlying the body region abuts the layer of dielectric material. In yet another embodiment, a portion of the first region underlies the drain region, and the buried region laterally circumscribes the portion of the first region. In another embodiment, the first region comprises an epitaxial layer of semiconductor material. In another exemplary embodiment, a method of fabricating a semiconductor device on a semiconductor substrate is provided. The method comprises forming a first region of semiconductor material on the semiconductor substrate, the first region having a first conductivity type, forming a second region of semiconductor material overlying the first region, the second region having a second conductivity type, forming a drift region of semiconductor material having the first conductivity type overlying the second region, at least a portion of the second region residing between the first region and the drift region, and forming a drain region of semiconductor material having the first conductivity type, wherein at least a portion of the drift region resides between the second region and the drain region. In one embodiment, the semiconductor substrate comprises a layer of semiconductor material having the second conductivity type overlying an insulating layer of dielectric material, wherein forming the first region comprises implanting ions of the first conductivity type in the layer of semiconductor material, resulting in the first region within the layer of semiconductor material, and forming the second region comprises epitaxially growing the second region of semiconductor material overlying the layer of semiconductor material. In a further embodiment, forming the drift region comprises forming a drift region having the first conductivity type within the second region, forming the drain region comprises forming a drain region having the first conductivity type within the drift region, and at least a portion of the layer of semiconductor material underlies the drain region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device structure comprising:
   a layer of dielectric material;
   a first region of semiconductor material overlying the layer of dielectric material, the first region having a first conductivity type and a first dopant concentration;
   a second region of semiconductor material having a second conductivity type, the second region overlying the first region;
   a drift region of semiconductor material having the first conductivity type overlying the second region, at least a portion of the second region residing between the first region and the drift region, the drift region having a second dopant concentration; and
   a drain region of semiconductor material having the first conductivity type and a third dopant concentration, wherein:
      at least a portion of the drift region resides between the second region and the drain region;
      the first dopant concentration is less than or equal to the second dopant concentration;
      the third dopant concentration is greater than the second dopant concentration; and
      the first region is isolated from the drift region.

2. The semiconductor device structure of claim 1, wherein the first region abuts the layer of dielectric material.

3. The semiconductor device structure of claim 1, further comprising a body region of semiconductor material having the second conductivity type, wherein the drift region comprises a lateral drift region that provides a path for current between the drain region and a channel within the body region.

4. The semiconductor device structure of claim 1, wherein a second portion of the second region underlies the drain region and abuts the first region.

5. The semiconductor device structure of claim 4, wherein the second portion of the second region resides laterally between portions of the first region.

6. The semiconductor device structure of claim 4, wherein the first region circumscribes the second portion.

7. The semiconductor device structure of claim 6, wherein lateral boundaries of the second portion are substantially vertically aligned with lateral boundaries of the drain region.

8. The semiconductor device structure of claim 1, wherein the first region underlies the drain region.

9. The semiconductor device structure of claim 8, wherein the first region and the drain region are vertically aligned.

10. The semiconductor device structure of claim 1, further comprising a third region of semiconductor material having the first conductivity type and the first dopant concentration, wherein:
    at least a portion of the second region resides between the third region and the lateral drift region;
    at least an interior portion of the second region underlying the drain region resides laterally between the first region and the third region; and
    a separation distance between interior boundaries of the first region and the third region is greater than or equal to a width of the drain region.

11. The semiconductor device structure of claim 1, wherein the first region is floating.

12. The semiconductor device structure of claim 1, wherein:
    a second portion of the second region underlies the drain region; and
    a width of the second portion is greater than or equal to a width of the drain region.

13. A semiconductor device structure comprising:
    a layer of dielectric material;
    a buried region of semiconductor material having a first conductivity type, the buried region overlying and abutting the layer of dielectric material;
    a first region of semiconductor material having a second conductivity type overlying the buried region;
    a drift region of semiconductor material having the first conductivity type overlying the first region;
    a drain region of semiconductor material having the first conductivity type within the drift region, the drain region having a dopant concentration greater than a dopant concentration of the drift region, wherein:
       at least a portion of the drift region resides between the drain region and the first region;
       at least a portion of the first region resides between the drift region and the buried region; and
       the buried region is isolated from the drift region.

14. The semiconductor device structure of claim 13, wherein a dopant concentration of the buried region is less than the dopant concentration of the drift region.

15. The semiconductor device structure of claim 13, further comprising a body region of semiconductor material having the second conductivity type, wherein at least a second portion of the first region underlying the body region abuts the layer of dielectric material.

16. The semiconductor device structure of claim 13, wherein the buried region comprises an annular doped region.

17. The semiconductor device structure of claim 16, wherein the drift region comprises a lateral drift region overlying the annular doped region.

18. A semiconductor device structure comprising:
a first region of semiconductor material having a first conductivity type and a first dopant concentration;
a second region of semiconductor material having a second conductivity type, the second region overlying the first region;
a drift region of semiconductor material having the first conductivity type overlying the second region, at least a portion of the second region residing between the first region and the drift region, the drift region having a second dopant concentration; and
a drain region of semiconductor material having the first conductivity type and a third dopant concentration, wherein:
at least a portion of the drift region resides between the second region and the drain region;
the first dopant concentration is less than or equal to the second dopant concentration;
the third dopant concentration is greater than the second dopant concentration;
the first region is isolated from the drift region;
a second portion of the second region underlies the drain region and abuts the first region; and
the second portion of the second region resides laterally between portions of the first region.

19. The semiconductor device structure of claim 18, wherein:
the drift region overlies the portions of the first region; and
the portion of the second region resides vertically between the portions of the first region.

* * * * *